(12) United States Patent
Lu et al.

(10) Patent No.: US 11,876,130 B2
(45) Date of Patent: Jan. 16, 2024

(54) III-NITRIDE TRANSISTOR WITH A MODIFIED DRAIN ACCESS REGION

(71) Applicant: Cambridge Electronics, Inc., Cambridge, MA (US)

(72) Inventors: Bin Lu, Watertown, MA (US); Dongfei Pei, Waban, MA (US); Xiabing Lou, Belmont, MA (US)

(73) Assignee: Finwave Semiconductor, Inc., Belmont, MA (US)

( * ) Notice: Subject to any disclaimer, the term of this patent is extended or adjusted under 35 U.S.C. 154(b) by 396 days.

(21) Appl. No.: 17/109,593

(22) Filed: Dec. 2, 2020

(65) Prior Publication Data
US 2021/0167202 A1    Jun. 3, 2021

Related U.S. Application Data

(60) Provisional application No. 62/943,204, filed on Dec. 3, 2019.

(51) Int. Cl.
*H01L 29/78* (2006.01)
*H01L 29/66* (2006.01)
*H01L 29/20* (2006.01)

(52) U.S. Cl.
CPC ...... *H01L 29/7802* (2013.01); *H01L 29/2003* (2013.01); *H01L 29/66712* (2013.01)

(58) Field of Classification Search
None
See application file for complete search history.

(56) References Cited

U.S. PATENT DOCUMENTS

| 10,103,219 B2 | 10/2018 | Pei et al. |
| 10,847,644 B2 | 11/2020 | Kinzer et al. |

(Continued)

FOREIGN PATENT DOCUMENTS

| TW | 201025599 A | 7/2010 |
| WO | 2016/050058 A1 | 4/2016 |

OTHER PUBLICATIONS

Song et al., "Normally off AlGaN/GaN Low-Density Drain HEMT (LDD-HEMT) With Enhanced Breakdown Voltage and Reduced Current Collapse", IEEE Electron Device Letters, vol. 28, No. 3, Mar. 2007.

(Continued)

*Primary Examiner* — Jack S Chen
(74) *Attorney, Agent, or Firm* — NIELDS, LEMACK & FRAME, LLC.

(57) ABSTRACT

This disclosure describes the structure and technology to modify the free electron density between the gate and drain electrodes of III-nitride semiconductor transistors. Electron density reduction regions (EDR regions) are disposed between the gate and the drain of the transistor structure. In certain embodiments, the EDR regions are created using trenches. In other embodiments, the EDR regions are created by implanting the regions with a species that reduces the free electrons in the channel layer. In another embodiment, the EDR regions are created by forming a cap layer over the barrier layer, wherein the cap layer reduces the free electrons in the channel beneath the cap layer. In another embodiment, a cap layer may be formed in the EDR regions, and doped regions may be created outside of the EDR regions, wherein the impurities act as electron donors.

18 Claims, 8 Drawing Sheets

(56) References Cited

U.S. PATENT DOCUMENTS

| | | | |
|---|---|---|---|
| 2007/0249119 | A1 | 10/2007 | Saito |
| 2007/0295993 | A1 | 12/2007 | Chen et al. |
| 2010/0084687 | A1 | 4/2010 | Chen et al. |
| 2013/0062664 | A1 | 3/2013 | Takeuchi et al. |
| 2013/0082277 | A1 | 4/2013 | Park et al. |
| 2015/0263107 | A1 | 9/2015 | Kobayashi |
| 2015/0349124 | A1* | 12/2015 | Lu .................... H01L 21/283 438/105 |

OTHER PUBLICATIONS

Peng et al., "Improvement of the Off-State Breakdown Voltage with Field Plate and Low-Density Drain in AlGaN/GaN High-Electron Mobility Transistors", Chin. Phys. B., vol. 24, No. 3, 2015.
International Search Report and Written Opinion dated Feb. 22, 2021 in corresponding PCT application No. PCT/US2020/062816.

* cited by examiner

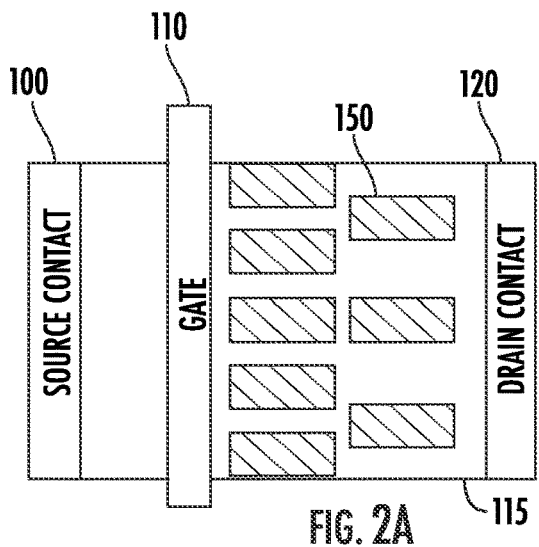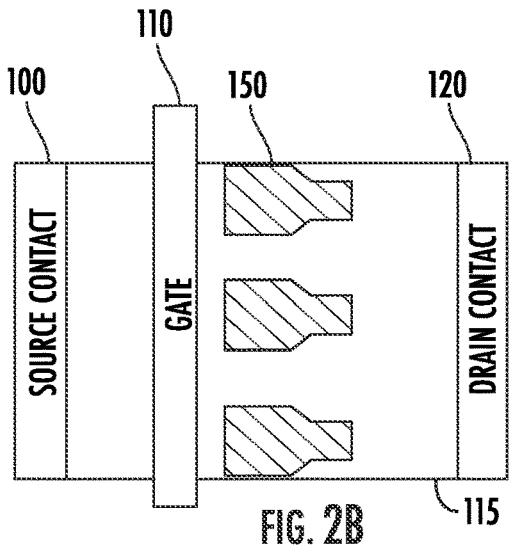
FIG. 2A    FIG. 2B
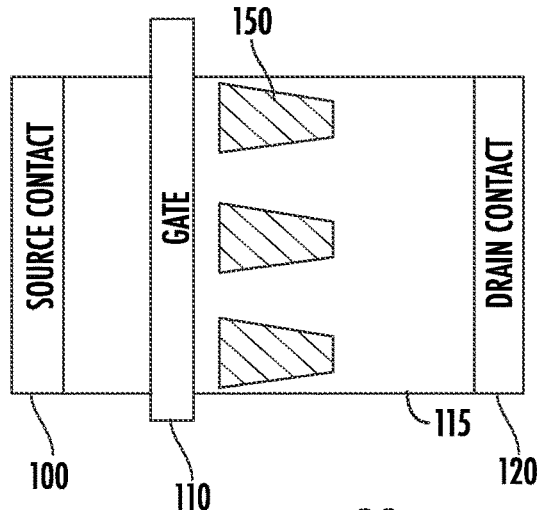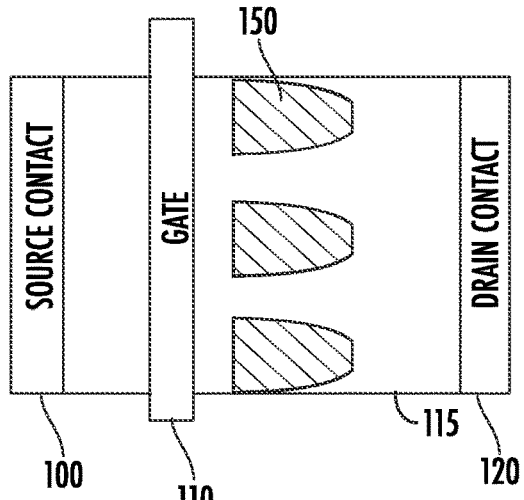
FIG. 2C    FIG. 2D
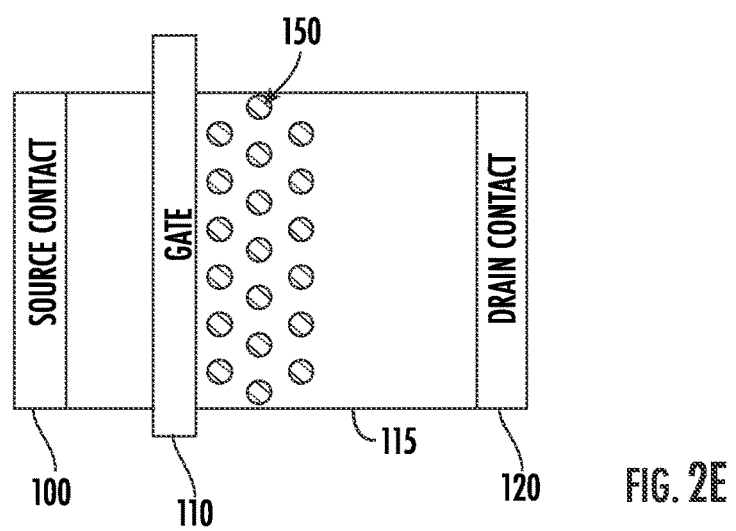
FIG. 2E

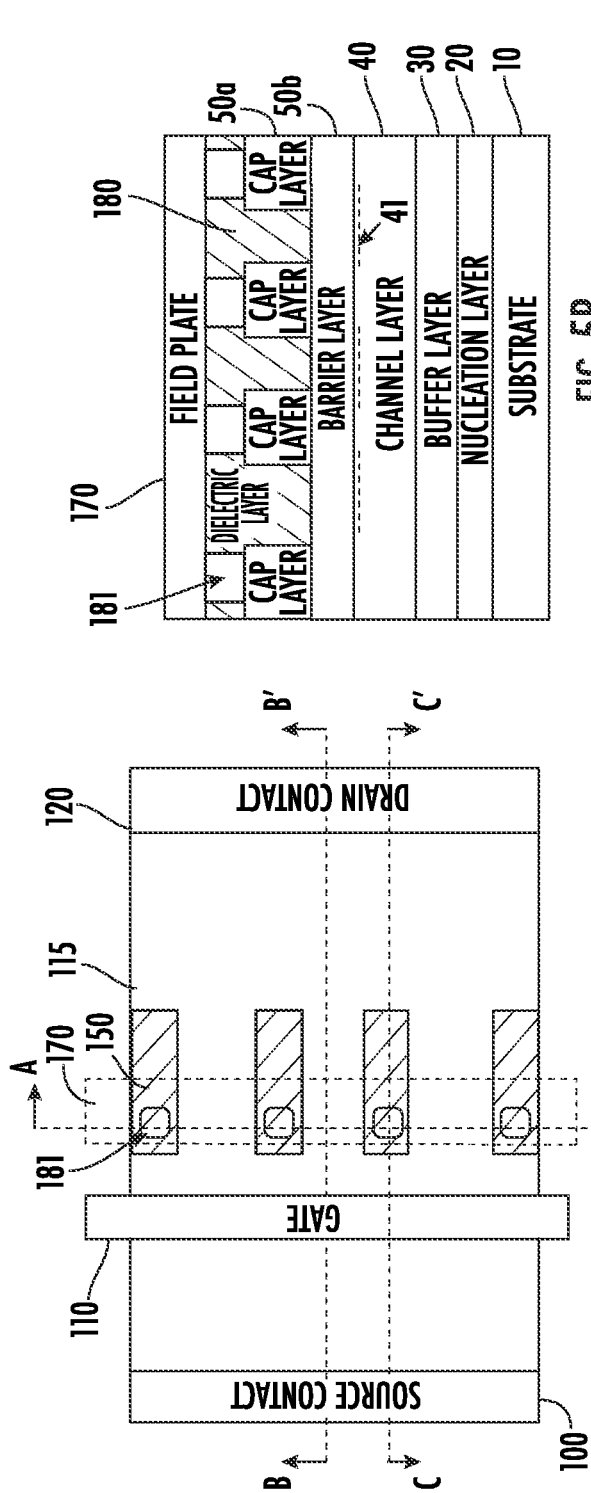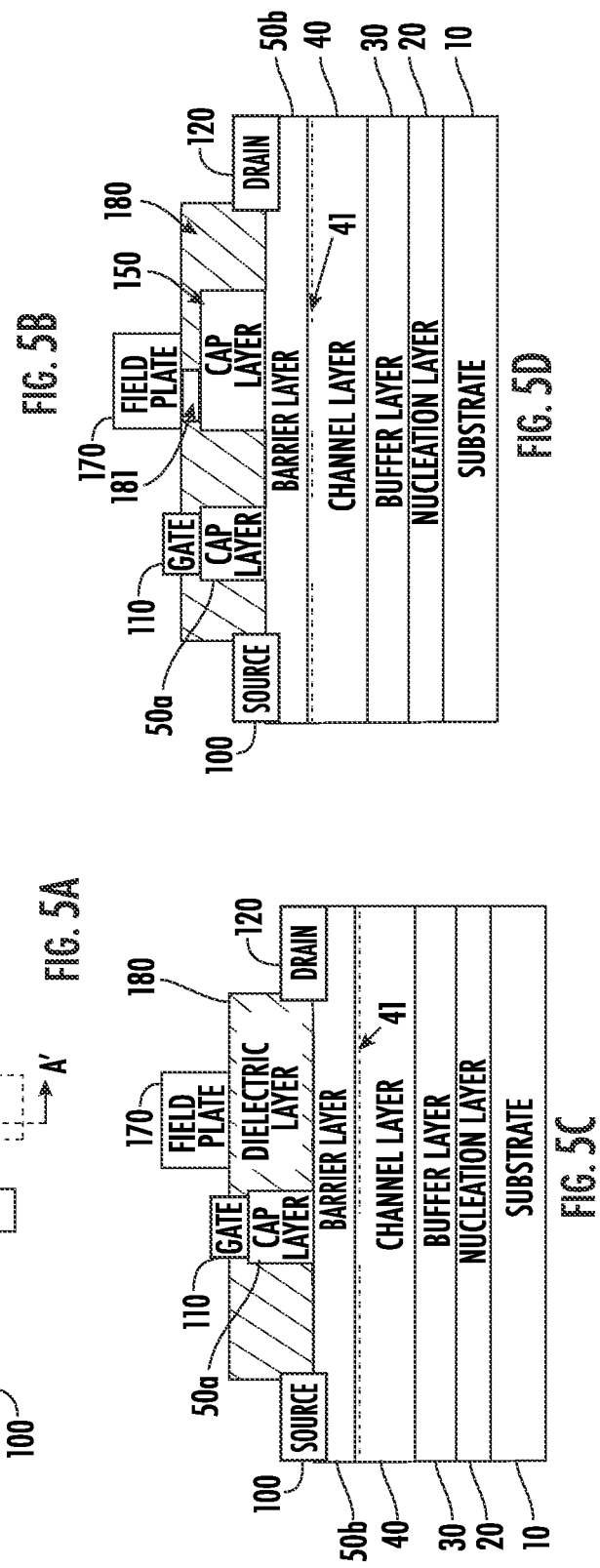

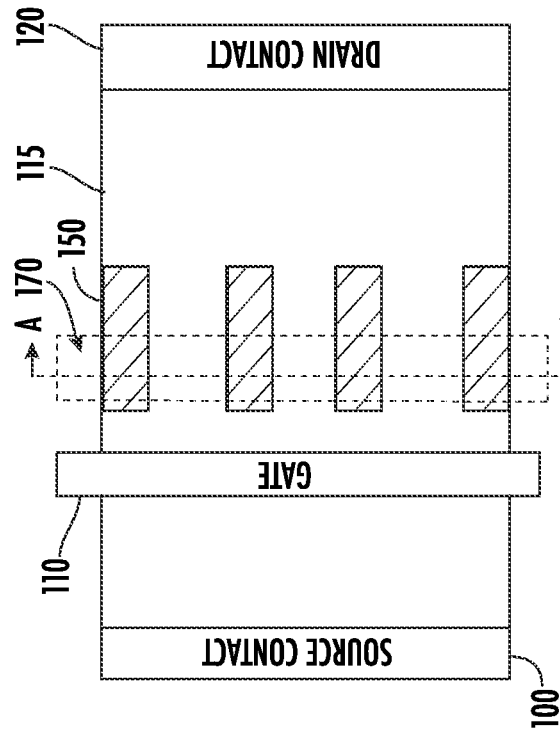
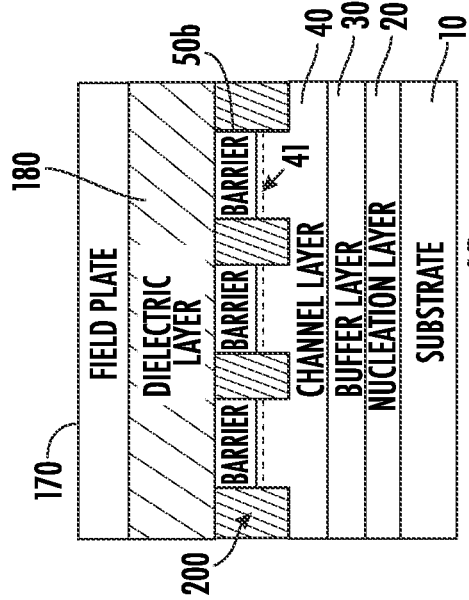
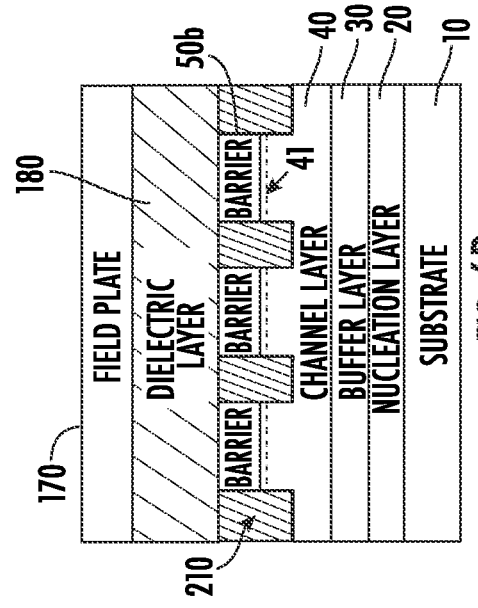
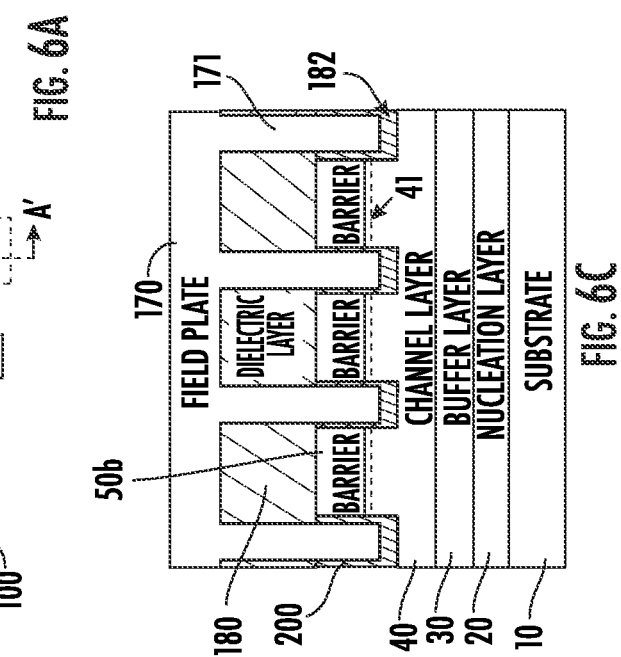

III-NITRIDE TRANSISTOR WITH A MODIFIED DRAIN ACCESS REGION

This application claims priority of U.S. Provisional Patent Application Ser. No. 62/943,204, filed Dec. 3, 2019, the disclosure of which is incorporated herein in its entirety.

FIELD

Embodiments of the present disclosure relate to transistor structures and methods for forming these transistor structures.

BACKGROUND

Compared with conventional power devices made of silicon, Group III-Nitride (III-N) semiconductors possess excellent electronic properties that enable the fabrication of modern power electronic devices and structures for use in a variety of applications. The limited critical electric field and relatively high resistance of silicon make currently available commercial power devices, circuits and systems constrained with respect to operating frequencies. On the other hand, the higher critical electric field and higher electron density and mobility of III-N materials allow high-current, high-voltage, high-power and/or high-frequency performance of improved power transistors. These attributes are desirable in advanced transportation systems, high-efficiency electricity generation and conversion systems, and energy delivery networks. Such systems rely on efficient power converters to modify electric voltages, and use power transistors capable of blocking large voltages and/or carrying large currents. For example, power transistors with blocking voltages of more than 500V are used in hybrid vehicles to convert DC power from the batteries to AC power. Some other exemplary applications of power transistors include power supplies, automotive electronics, automated factory equipment, motor controls, traction motor drives, high voltage direct current (HVDC) electronics, lamp ballasts, telecommunication circuits and display drives.

Conventional III-nitride semiconductor transistors have a uniform electron density in the access region between the gate and drain electrodes.

It would be beneficial if there were a transistor structure with non-uniform electron density between the gate and drain electrodes. Further, it would be advantageous if the non-uniform electron density distribution could be used for shaping the electric field.

SUMMARY

This disclosure describes the structure and technology to modify the free electron density between the gate electrode and drain contact of III-nitride semiconductor transistors. Electron density reduction regions (EDR regions) are disposed between the gate electrode and the drain contact of the transistor structure. In certain embodiments, the EDR regions are created using trenches. In other embodiments, the EDR regions are created by implanting the regions with a species that reduces the free electrons in the channel layer. In another embodiment, the EDR regions are created by forming a cap layer over the barrier layer, wherein the cap layer reduces the free electrons in the channel beneath the cap layer. In another embodiment, a cap layer may be formed in the EDR regions, and doped regions may be created outside of the EDR regions, wherein the impurities act as electron donors. In some embodiments, a field plate may be disposed on the EDR regions, and may be connected or separated from the EDR region.

According to one embodiment, a semiconductor structure for use in a III-Nitride (III-N) semiconductor device is disclosed. The semiconductor structure comprises a channel layer; a barrier layer, wherein electrons are formed at an interface between the channel layer and the barrier layer; a source contact and a drain contact disposed in ohmic recesses in contact with the barrier layer; a gate electrode disposed between the source contact and the drain contact, wherein a region between the drain contact and the gate electrode comprises a drain access region; and one or more electron density reduction regions disposed in the drain access region, wherein electron density in the electron density reduction regions is reduced as compared to other portions of the drain access region. In certain embodiments, each electron density reduction region has a length (La) and a width (Wa), and is separated from an adjacent electron reduction region by a separation distance (Wb), wherein the separation distance (Wb) changes moving from the gate electrode to the drain contact. In some embodiments, the electron density reduction regions comprise trenches wherein a depth of the trenches is less than, the same as, or greater than a thickness of the barrier layer. In certain embodiments, the electron density reduction regions comprise implanted regions in the barrier layer, wherein a depth of the implanted region is less than, the same as, or greater than a thickness of the barrier layer. In some embodiments, the implanted regions are implanted with nitrogen, argon, fluorine, or magnesium. In some embodiments, the electron density reduction regions comprise a cap layer disposed on the barrier layer, and wherein the cap layer is not disposed on the barrier layer in the other portions of the drain access region, and the cap layer comprises a Mg-doped III-nitride semiconductor. In certain embodiments, the semiconductor structure further comprises a cap layer disposed on an entirety of the barrier layer in the drain access region, and wherein impurities are introduced into the cap layer disposed in the other portions of the drain access region to form doped regions and wherein the impurities are not introduced into the cap layer in the electron density reduction regions. In some embodiments, the cap layer comprises a Mg-doped III-nitride semiconductor and the impurities comprise silicon, oxygen or hydrogen.

According to another embodiment, a semiconductor structure for use in a III-Nitride (III-N) semiconductor device is disclosed. The semiconductor structure comprises a channel layer; a barrier layer, wherein electrons are formed at an interface between the channel layer and the barrier layer; a source contact and a drain contact disposed in ohmic recesses in contact with the barrier layer; a gate electrode disposed between the source contact and the drain contact, wherein a region between the drain contact and the gate electrode comprises a drain access region; one or more electron density reduction regions disposed in the drain access region, wherein electron density in the electron density reduction regions is reduced as compared to other portions of the drain access region and wherein a cap layer comprising a Mg-doped III-nitride semiconductor is disposed in the electron density reduction regions and not disposed in other portions of the drain access region; and a field plate disposed above at least a portion of the electron density reduction regions, and wherein portions of the field plate are separated from the electron density reduction region by a dielectric layer. In some embodiments, a drain side edge of the field plate is closer to the drain contact than a source side edge of the electron density reduction region, and wherein a drain side edge of the electron density reduction region is at least as close to the drain contact as the drain side edge of the field plate. In some embodiments, the dielectric layer is disposed in the region between the source contact and the drain contact. In certain embodiments, the semiconductor structure further comprises a second field plate disposed between the field plate and the drain contact. In some embodiments, the electron density reduction regions extend beneath the gate electrode. In some embodiments, the field plate is connected to the gate electrode. In certain embodiments, the electron density reduction regions do not extend beneath the gate electrode. In certain embodiments, the field plate connects to the cap layer of the electron density reduction regions through openings in the dielectric layer.

According to another embodiment, a semiconductor structure for use in a III-Nitride (III-N) semiconductor device is disclosed. The semiconductor structure comprises a channel layer; a barrier layer, wherein electrons are formed at an interface between the channel layer and the barrier layer; a source contact and a drain contact disposed in ohmic recesses in contact with the barrier layer; a gate electrode disposed between the source contact and the drain contact, wherein a region between the drain contact and the gate electrode comprises a drain access region; one or more electron density reduction regions disposed in the drain access region, wherein electron density in the electron density reduction regions is reduced as compared to other portions of the drain access region and wherein the electron density reduction regions do not extend under the gate electrode; and a field plate disposed above at least a portion of the electron density reduction regions, and wherein the field plate is separated from the electron density reduction region by a dielectric layer. In certain embodiments, the electron density reduction regions comprise trenches, and wherein a depth of the trenches is less than, the same as or greater than a thickness of the barrier layer. In some embodiments, the field plate comprises protrusions that extend downward into the trenches below the interface between the channel layer and the barrier layer. In certain embodiments, the electron density reduction regions comprise implanted regions in the barrier layer and the channel layer, wherein a depth of the implanted region is smaller, the same or greater than a thickness of the barrier layer; and wherein the implanted regions are implanted with nitrogen, argon, fluorine, or magnesium.

BRIEF DESCRIPTION OF THE FIGURES

For a better understanding of the present disclosure, reference is made to the accompanying drawings, which are incorporated herein by reference and in which:

FIGS. 2A-2E are top views of a transistor structure according to five embodiments;

FIG. 5A is a top view of a transistor structure having a cap layer and a separate field plate according to one embodiment;

FIG. 5B is a cross-section of the transistor structure of FIG. 5A along line A-A';

FIG. 5C is a cross-section of the transistor structure of FIG. 5A along line B-B';

FIG. 5D is a cross-section of the transistor structure of FIG. 5A along line C-C';

FIG. 6A is a top view of a transistor structure having a cap layer and a field plate covering a portion of the electron reduction region according to one embodiment;

FIG. 6B is a cross-section of the transistor structure of FIG. 6A along line A-A' in which the EDR regions comprise trenches;

FIG. 6C is a cross-section of the transistor structure of FIG. 6A along line A-A' in which the EDR regions comprise trenches with the field plate electrode is disposed in the trenches;

FIG. 6D is a cross-section of the transistor structure of FIG. 6A along line A-A' wherein the electron reduction region is an implanted region.

DETAILED DESCRIPTION

Embodiments of the present disclosure relate to transistor structure with non-uniform electron density between the gate and drain electrodes. The semiconductor structures described herein may be formed of compound semiconductor materials, such as III-V semiconductor materials, and particularly Group III-Nitride (III-N) semiconductor materials.

Figure 1A:
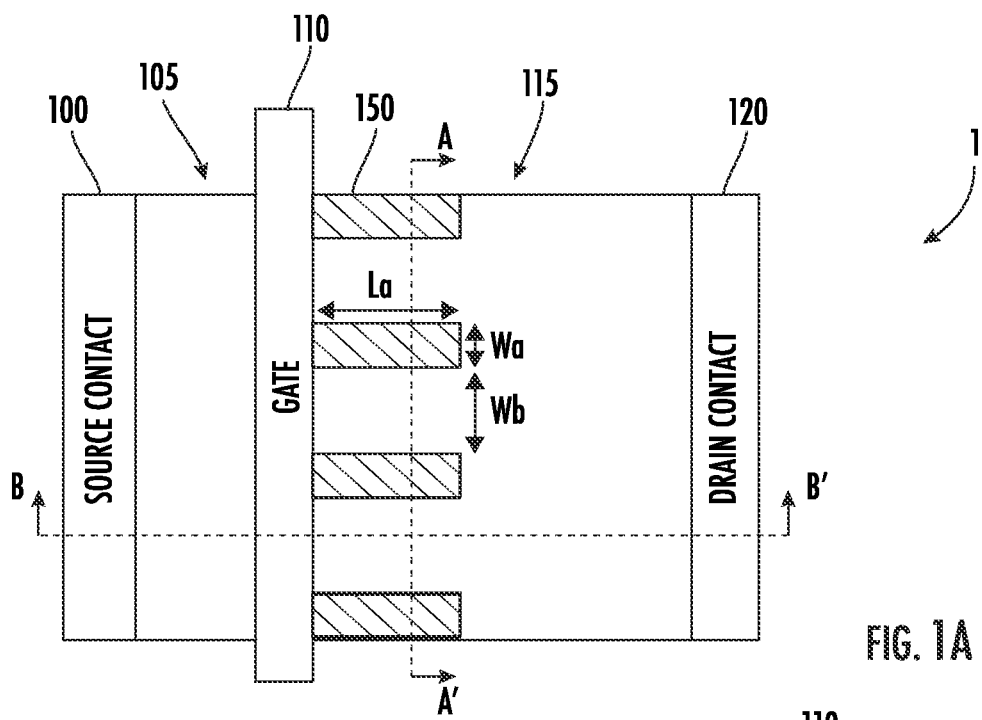
FIG. 1A is a top view of a transistor structure according to one embodiment.

FIG. 1A shows a top view of a transistor structure 1 comprising a source contact 100, a gate electrode 110, and a drain contact 120. A source access region 105 is disposed between the source contact 100 and the gate electrode 110. Additionally, a drain access region 115 is disposed between the gate electrode 110 and the drain contact 120. The source contact 100 may also be an electrode. Similarly, the drain contact 120 may also be an electrode. These electrodes may be made of material selected from titanium, aluminum, titanium nitride, tungsten, tungsten nitride, nickel, gold, copper, platinum, molybdenum, and any other suitable conductive material or combination of conductive materials. The source contact 100 and the drain contact 120 form ohmic contacts to the barrier layer 50b (see FIG. 1C).

As shown in FIG. 1A, one or more electron density reduction regions, or EDR regions 150 are shown. Each of these regions may also be referred to as region-a. These EDR regions 150 may have a length of La, a width of Wa and separation distance of Wb. In this disclosure, length is defined as the direction from the source contact 100 to the drain contact 120. Width is the direction perpendicular to the length. Further, the EDR regions 150 are located between the gate electrode 110 and the drain contact 120 in the drain access region 115.

Figure 1B:
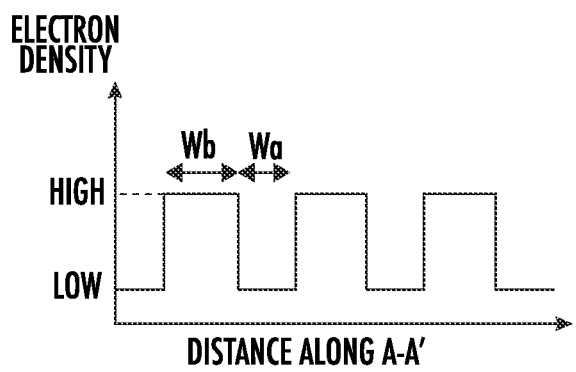
FIG. 1B is the electron density of the transistor structure of FIG. 1A along line A-A'.

The existence of these EDR regions 150 serves to reduce the free electron density in these regions, as shown in FIG. 1B, as compared to regions in the drain access region 115 outside the EDR regions 150. The free electron density in EDR regions 150 can be as low as zero. Specifically, in the cross-section shown in FIG. 1B, the electron density in the portions of the drain access region 115 that correspond to the EDR regions 150 is less than the other portions of the drain access region 115.

Further, while FIG. 1B shows that the reduction of electron density achieved by each EDR region 150 is the same, it is understood that each EDR region 150 may reduce the electron density by any amount, independent of other EDR regions 150.

Figure 1C:
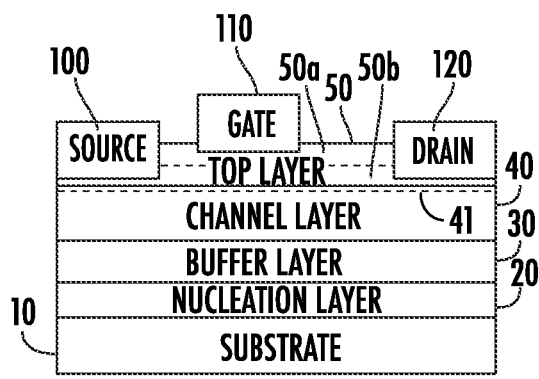
FIG. 1C is a cross-section of the transistor structure of FIG. 1A taken along line B-B'.

FIG. 1C shows the cross-section of the III-nitride semiconductor transistor structure 1 along the cutline B-B'. The transistor structure 1 comprises a substrate 10, which may be made of Si, SiC, Sapphire, III-nitride semiconductor or any other suitable material.

In some embodiments, the semiconductor transistor structure 1 may include a nucleation layer 20, formed on the substrate 10. The nucleation layer 20 may include AlN.

A buffer layer 30 is formed over the nucleation layer 20. The buffer layer 30 may have a thickness between 0.5 nm and several microns. A channel layer 40 is formed over the buffer layer 30. The buffer layer 30 and channel layer 40 comprise III-nitride semiconductors including GaN, AlGaN, InGaN, InAlN, InAlGaN and AlN. Free electrons 41 exist in the channel layer 40 to conduct electrical current between the drain contact 120 and the source contact 100. The channel layer 40 may comprise a single layer such as a GaN layer, or multiple layers. In one example, the channel layer 40 comprises a back-barrier structure, such as a GaN layer over an AlGaN layer (GaN/AlGaN) or a GaN layer over an InGaN layer and another GaN layer (GaN/InGaN/GaN). In another example, the channel layer 40 has a superlattice structure formed by repeating a bi-layer structure of AlGaN/GaN or AlN/GaN. The thickness of the channel layer 40 may be 5 nm, although other thicknesses may be used. The thickness of the buffer layer 30 may be between zero and a few microns, although other thicknesses are within the scope of the disclosure.

A top layer 50 is formed over the channel layer 40. The top layer 50 comprises a barrier layer 50b made of III-nitride semiconductors selected from AlGaN, InAlN, AlN or InAlGaN. The barrier layer 50b is formed on the channel layer 40. The top layer 50 may optionally also have a cap layer 50a made of III-nitride semiconductors including GaN, AlGaN, InGaN, InAlGaN. When present, the cap layer 50a is formed on the barrier layer 50b. The barrier layer 50b and the cap layer 50a may be un-doped, doped with Si or doped with Mg or other impurities.

In one embodiment of the transistor structure 1, the top layer 50 comprises a GaN cap layer 50a disposed on an AlGaN barrier layer 50b. The AlGaN barrier layer 50b is formed over channel layer 40 comprising GaN. Free electrons 41 are formed at the interface between the AlGaN barrier layer 50b and the GaN channel layer 40. Specifically, electrons 41 are formed as a two dimensional electron gas (2DEG) at the interface between the channel layer 40 and the barrier layer 50b.

The III-nitride semiconductor transistor 1 shown in FIG. 1C may be a normally-on transistor with free electrons 41 underneath the gate electrode 110 without any applied gate voltage or a normally-off transistor without free electrons 41 underneath the gate electrode 110 without any applied gate voltage. The normally-off transistor may have a recessed region in the top layer 50 underneath the gate electrode 110 or a Mg-doped III-nitride layer underneath the gate electrode 110.

The gate electrode 110 is formed over the top layer 50. There may be a dielectric layer between the gate electrode 110 and the top layer 50. The dielectric layer may be selected from material including $SiO_2$, $Si_xN_y$, $SiO_xN_y$, $Al_2O_3$, $HfO_2$ and any other suitable dielectric material. In one example, the gate electrode 110 may make electrical contact to the top layer 50 directly forming a Schottky contact or ohmic contact.

The source contact 100 and the drain contact 120 may also be disposed on or in the top layer 50. In certain embodiments, the top layer 50 may be thinner beneath the gate electrode 110, the source contact 100 and the drain contact 120. In some embodiments, the source contact 100 and the drain contact 120 may rest directly on the channel layer 40.

The III-nitride semiconductor transistor structure may be formed with Gallium-face or Nitrogen-face III-nitride semiconductors.

The EDR regions 150 are formed between the gate electrode 110 and the drain contact 120. The gate electrode 110 may overlap part of the EDR regions 150, be flush with an edge of the EDR regions 150 or be separated from the EDR regions 150.

The separation distance, Wb, between each of the EDR regions 150 may change moving from gate electrode 110 towards the drain contact 120. FIGS. 2A-2D show top views of four embodiments of the semiconductor transistor structure wherein the separation distance between adjacent EDR regions 150 is changing from the gate electrode 110 towards the drain contact 120. In certain embodiments, the separation distance between adjacent EDR regions 150 increases from the gate electrode 110 towards the drain contact 120. The shape of the EDR region 150 and its arrangement between the gate electrode 110 and the drain contact 120 may vary as shown in FIGS. 2A-2E. As a result, the average free-electron density may vary from the gate electrode 110 towards the drain contact 120.

The length of the EDR regions 150 may change from the gate electrode 110 towards the drain contact 120. In certain embodiments, the length of the EDR regions 150 increases from the gate electrode 110 towards the drain contact 120. In certain embodiments, the shape of EDR region 150 may be circular or oval as shown in FIG. 2E. In the case of non-regular polygons, such as those shown in FIGS. 2B-2E, each EDR region 150 may still have a length, La, a width, Wa, and a separation distance, Wb. The density of the EDR regions 150 in FIG. 2E may be uniform or changing from the gate electrode 110 towards the drain contact 120.

The width of the EDR regions 150, Wa, ranges from 10 nm to over 1 um. The separation between adjacent EDR regions 150, Wb, ranges from 10 nm to over 1 um. The ratio, Wb/(Wa+Wb), ranges from 5% to 95%. The length of the EDR regions 150, La, ranges from 10 nm to over 1 um. The edges of the EDR regions 150 may or may not be aligned with III-nitride crystalline planes.

Figure 3A:
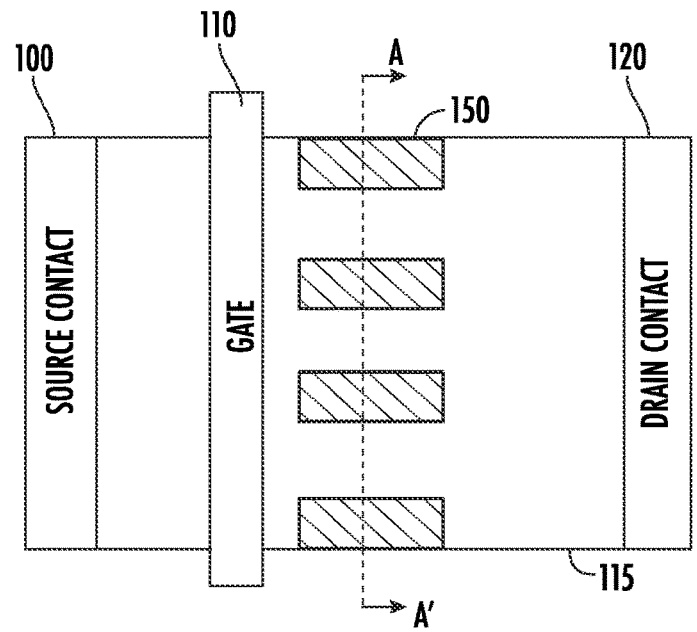
FIG. 3A is a top view of a transistor structure according to another embodiment.

FIG. 3A shows a top view of a transistor structure 1 having a plurality of EDR regions 150. FIGS. 3B-3E show four different cross-sectional views of the transistor structure 1 through cut line A-A'. Each of these cross-sections shows a different example of an EDR region 150.

Figure 3B:
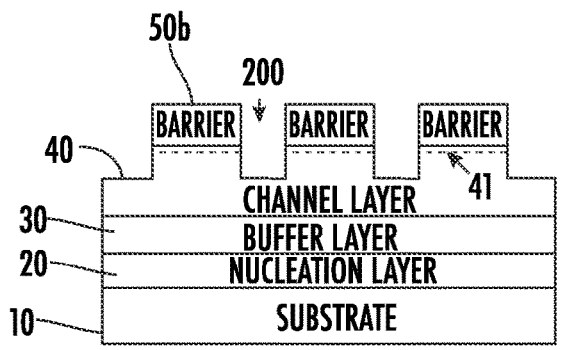
FIGS. 3B-3E are cross-sections of the transistor structure of FIG. 3A along line A-A' according to four different embodiments.

In FIG. 3B, the EDR region 150 is formed by etching trenches 200 into the barrier layer 50b and optionally into the channel layer 40. The trenches 200 remove free electrons in the channel layer 40. This is because electrons travel at the interface between the barrier layer 50b and the channel layer 40. By etching through the barrier layer 50b, the area that is used to transport electrons is reduced. In some embodiments, the trenches 200 may be etched so as to remove an entire thickness of the barrier layer 50b in the EDR regions 150. In this way, the interface between the barrier layer 50b and the channel layer 40 in the EDR regions 150 is eliminated. In certain embodiments, the trenches 200 extends into the channel layer 40. In other embodiments, the trenches 200 do not extend through the entirety of the barrier layer 50b. Thus, the depth of the trenches 200 may be less than, the same as or greater than a thickness of the barrier layer 50b. The trenches 200 may be filled with a dielectric material, such as $SiN_x$, $SiO_2$, $SiON$, $Al_2O_3$, $ZrO_2$, $HfO_2$ and others. The trenches 200 may be created using any etching process.

Figure 3C:
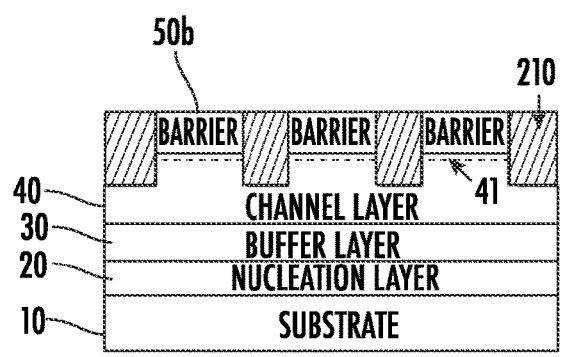

In FIG. 3C, the EDR region 150 is formed by ion implantation that lowers or eliminates the free electrons 41 in the channel layer 40 in the implanted region. The species used for the ion implantation may be selected from nitrogen, argon, fluorine, magnesium or any other suitable element. In certain embodiments, the energy of the implant may be selected so that the implanted region 210 extends through the entire thickness of the barrier layer 50b. In certain embodiments, the implant energy is sufficient so that the implanted region 210 extends into the channel layer 40. In other embodiments, the implantation depth may be less than the thickness of the barrier layer 50b. The dose may be selected to eliminate or reduce free electrons 41 near the interface between the channel layer 40 and the barrier layer 50b.

Figure 3D:
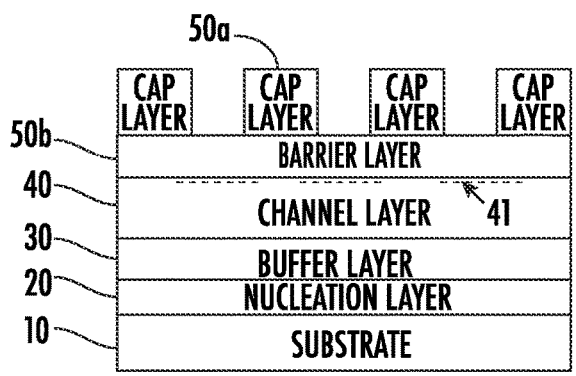

In FIG. 3D, the EDR region 150 is formed by disposing a cap layer 50a over the barrier layer 50b, wherein the cap layer 50a reduces or depletes the free electrons 41 in the channel layer 40 beneath the cap layer 50a. The other areas of the drain access region 115 may not have a cap layer 50a. In other words, the cap layer 50a is limited only to the EDR regions 150. Thus, free electrons 41 exist in the channel layer 40 where the cap layer 50a is absent. The cap layer 50a may include Mg-doped III-nitride semiconductors such as Mg-doped GaN, AlGaN, InN or InGaN. The cap layer 50a may have a thickness from 5 nm to over 200 nm.

Figure 3E:
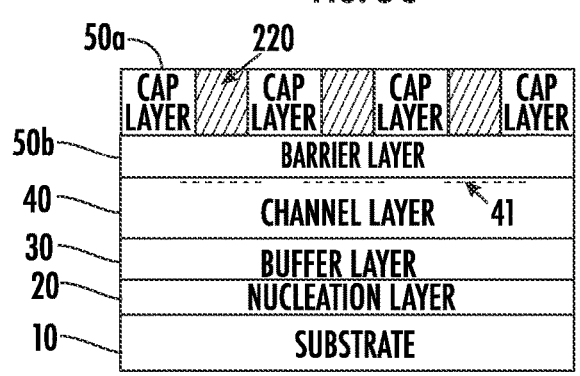

IN FIG. 3E, similar to FIG. 3D, the free electron density reduction or depletion of free electrons 41 in the channel layer 40 of the EDR region 150 is achieved by having a cap layer 50a over the barrier layer 50b. However, the region outside the EDR regions 150 is replaced with doped regions 220. The doped region 220 is formed by introducing silicon, oxygen, hydrogen or any other suitable impurity in the cap layer 50a or into the channel layer 40 outside of the EDR region 150 to create free electrons in the channel layer 40 outside the EDR regions 150. The doped region 220 can also be formed by epi-regrowth. The depth of the doped regions 220 may be the same, smaller or thicker than the thickness of the cap layer 50a. The impurities may be introduced using ion implantation, epi-regrowth, or other suitable methods. As a result, free electrons 41 are formed in the channel layer under or in the doped regions 220, where the impurities create electron donors.

Thus, the EDR region 150 may be created through etching, implanting, epitaxy re-growth, using a cap layer or by using a cap layer in conjunction with a doped region.

A combination of the above embodiments is also possible to modify the free-electron density in the channel layer 40.

Having described various methods to create the EDR regions 150, several specific examples will be discussed.

Example 1

FIGS. 4A-4D show one embodiment. This embodiment utilizes the EDR regions 150 that are shown in FIG. 3D.

Figure 4A:
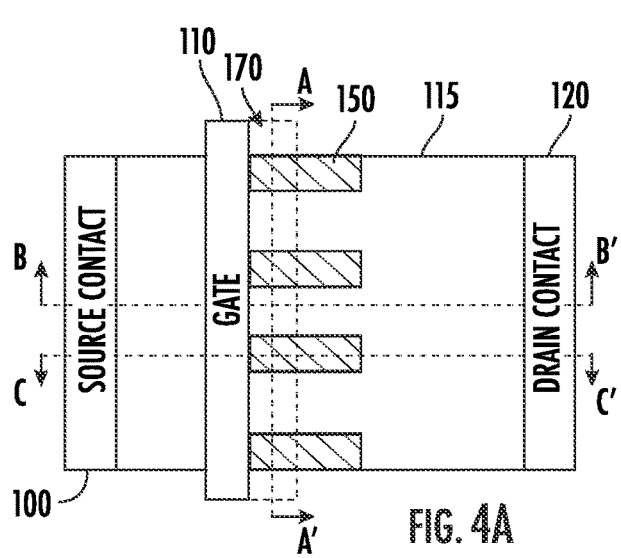
FIG. 4A is a top view of a transistor structure having a cap layer and gate-connected field plate according to one embodiment.

The top-view of the transistor structure is shown in FIG. 4A. In this embodiment, a gate-connected field plate 170 is disposed on top of the gate electrode 110 and extends into the drain access region 115. The gate-connected field plate 170 may be an electrode and be constructed of the same material as the gate electrode 110. In this embodiment, the EDR regions 150 are formed using stripes of cap layer 50a in the drain access region 115 between the gate electrode 110 and drain contact 120. Of course, other shapes may also be used.

Figure 4B:
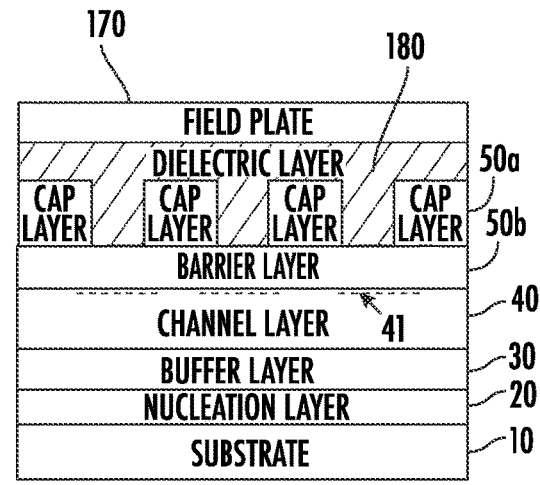
FIG. 4B is a cross-section of the transistor structure of FIG. 4A along line A-A'.

As shown in FIG. 4B, the cap layer 50a depletes the electrons in the channel layer 40 disposed beneath the cap layer 50a. However, between the adjacent EDR regions 150, free electrons 41 are formed in the channel as two-dimensional electron gas (2DEG) at the interface between the channel layer 40 and the barrier layer 50b. In this embodiment, the EDR regions 150 extend from beneath the gate electrode 110 toward the drain contact 120.

Figure 4C:
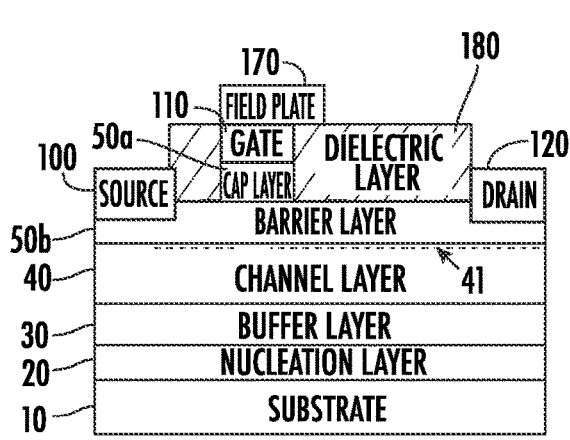
FIG. 4C is a cross-section of the transistor structure of FIG. 4A along line B-B'.

The transistor structure shown in FIG. 4C is a normally-off transistor where the cap layer 50a underneath the gate electrode 110 depletes the 2DEG. However, a normally-on transistor can be formed by removing at least a portion of the cap layer 50a underneath the gate electrode 110, such as in the region between the EDR regions 150 along the B-B' cutline. In another embodiment of a normally-on transistor, the cap layer 50a is entirely absent from underneath the gate electrode 110.

Figure 4D:
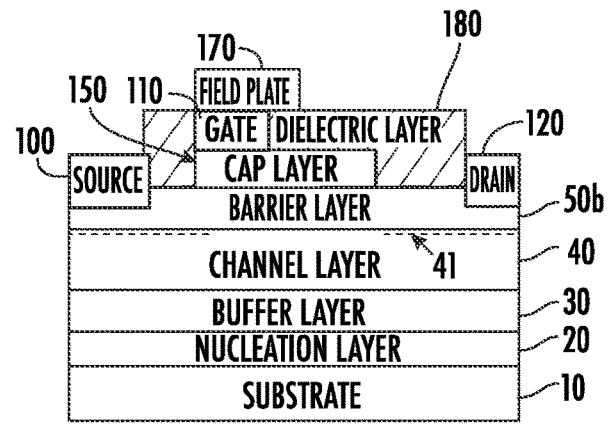
FIG. 4D is a cross-section of the transistor structure of FIG. 4A along line C-C'.

FIG. 4D shows the cross section along C-C' cutline of FIG. 4A. The two-dimensional electron gas is depleted under the cap layer 50a. The gate electrode 110 makes contact to the cap layer 50a near the source side. The gate-connected field plate 170 is formed over a dielectric layer 180 where the dielectric layer 180 covers the cap layer 50a as shown in FIG. 4D. Note that, in certain embodiments, the dielectric layer 180 extends from the source contact 100 to the drain contact 120. The dielectric layer 180 is selected from material including $SiO_2$, $Si_xN_y$, $Al_2O_3$, $SiO_xN_y$, or any other suitable dielectric material and their combination. The gate electrode 110 makes electrical contact with the cap layer 50a through an opening in the dielectric layer 180 as shown in FIG. 4C-4D. The gate-connected field plate 170 is electrically connected to the gate electrode 110. The drain side edge of the gate-connected field plate 170 does not extend beyond the drain side edge of EDR regions 150 as shown in FIG. 4D. In other words, the drain side edge of the EDR regions 150 is closer to the drain contact 120 than the drain side edge of the field plate 170. In certain embodiments, the drain side edge of the gate-connected field plate 170 are at least as close to the drain contact 120 as the source side edge of the EDR region 150. However, it is possible to have a second field plate (not shown) which extends over the drain side edge of the EDR region 150 where the second field-plate is disposed over a thicker dielectric layer than the gate-connected field plate 170.

Figure 4E:
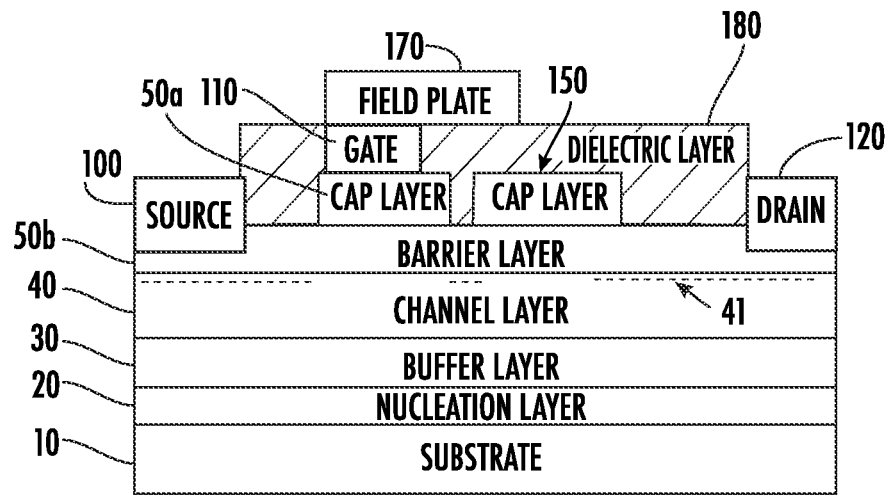
FIG. 4E is a cross-section of another transistor structure similar to that shown in FIG. 4D.

FIG. 4E shows another embodiment of a transistor structure. This is similar to FIG. 4D, the cross section along C-C' cutline of FIG. 4A, except the cap layer 50a in the EDR region 150 is separated from the cap layer 50a in contact with the gate electrode 110. In certain embodiments, the drain side edge of the gate-connected field plate 170 is closer to the drain contact 120 than the source side edge of the EDR region 150. In this way, the field plate 170 partially overlaps the EDR region 150. The drain side edge of the gate-connected field plate 170 does not extend beyond the drain side edge of EDR regions 150 as shown in FIG. 4E. In other words, the drain side edge of the EDR regions 150 are closer to the drain contact 120 than the drain side edge of the field plate 170. However, it is possible to have a second field plate (not shown) which extends over the drain side edge of the EDR region 150 where the second field-plate is disposed over a thicker dielectric layer than the gate-connected field plate 170.

Figure 4F:
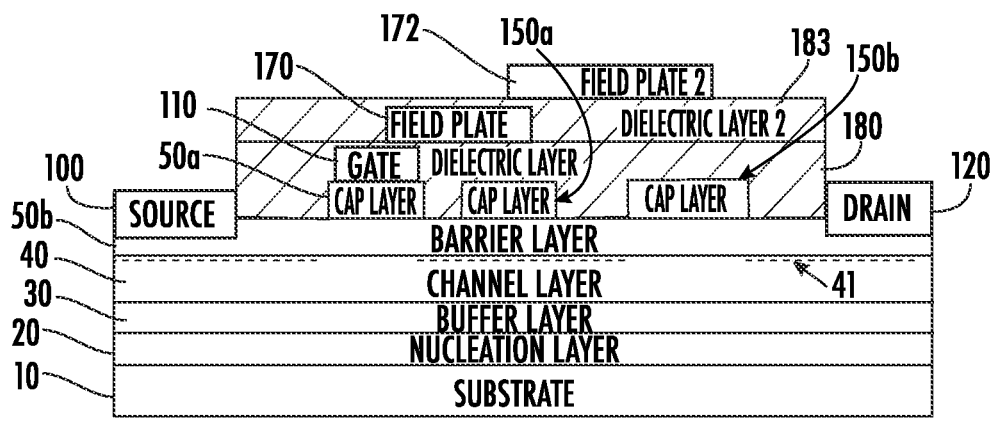
FIG. 4F is a cross-section of another transistor structure similar to that shown in FIG. 4E.

FIG. 4F shows another embodiment of a transistor structure. This is similar to FIG. 4E, the cross section along C-C' cutline of FIG. 4A, except that there are multiple field plates. Additionally, FIG. 4F shows multiple EDR regions 150a, 150b disposed in the length direction, where EDR region 150a is closer to the gate electrode 110 than EDR region 150b.

In this figure, field plate 170 and second field plate 172 may be connected together and connected to the source contact 100 to form source-connected field plates. Alternatively, the field plate 170 may be connected to the gate electrode 110 while the second field plate 172 may be also connected to the gate electrode 110 or to the source contact 100. The field plate 170 may or may not overlap with the gate electrode 110. The second field plate 172 may or may not overlap with field plate 170. The EDR regions 150a, 150b are formed by isolated cap layer 50a. Field plate 170 overlaps with EDR region 150a while second field plate 172 overlaps with EDR region 150b. The drain side edge of the field plate 170 is between the source and drain edges of the EDR region 150a and drain side edge of the second field plate 172 is between the source and drain edges of the EDR region 150b. Second field plate 172 has thicker dielectric layer 183 underneath than the field plate 170. The dielectric layer 180 and thicker dielectric layer 183 can be made of the same dielectric material or different dielectric materials.

The top view of the EDR regions 150a and 150b of FIG. 4F may have shapes and arrangement shown in FIG. 2A-2E. In another embodiment, additional EDR regions may be present between the EDR regions 150b and the drain contact 120 and additional field plates may be positioned over the additional EDR regions, covering at least a portion of the additional EDR regions.

The transistors in FIGS. 4A-4F are made with III-nitride semiconductors. The cap layer 50a may be formed by Mg-doped GaN, AlGaN or InGaN semiconductors with a thickness ranging from 2 nm to over 300 nm. The barrier layer 50b is made of III-nitride semiconductors including AlGaN, AlN, InAlN, GaN, InGaN, or InAlGaN. In one example, the barrier layer 50b has a sub-layer made of AlGaN which has a thickness between 1 nm and 20 nm and Al composition ranging between 5% and 100%. In another example, the barrier layer 50b has a few sub-layers such as an AlGaN layer over an AlN layer, or an AlN layer over an AlGaN layer. The channel layer 40 is made of GaN, InGaN, AlGaN or a combination of the material forming a multi-layer structure such as a super-lattice structure or a back-barrier structure. The band-gap of the barrier layer 50b in immediate contact with the channel layer 40 is larger than that of the channel layer 40 in immediate contact with the barrier layer 50b. The buffer layer 30 and nucleation layer 20 are made of III-nitride semiconductors. The substrate 10 is made of Si, SiC, Sapphire or any other suitable material.

The gate electrode 110, source contact 100 and drain contact 120 are made of material selected from Ni, Au, Ti, Al, TiN, W, WN, Pt, Cu, Mo and any other suitable material and their combination. The source contact 100 and the drain contact 120 may be formed in recessed regions in the barrier layer 50b under the contacts. In some examples, there is a gate dielectric material underneath the gate electrode 110, insulating at least a part of the gate electrode 110 from contacting the cap layer 50a.

Example 2

FIGS. 5A-5D show another embodiment. This embodiment is similar to the embodiment shown in FIGS. 4A-4D, except that the EDR regions 150 are separated from the gate electrode 110. A separate field plate 170 is formed over the EDR regions 150. The field plate 170 makes electrical contact with the EDR regions 150 through openings 181 in a dielectric layer 180, as shown in FIG. 5B. In other words, conductive material fills the openings 181 such that the field plate 170 is in electrical contact with the EDR regions 150. Like FIGS. 4A-4D, the EDR regions 150 are formed by the cap layer 50a in the form of stripes in the drain access region 115 between the gate electrode 110 and drain contact 120. Of course, the EDR regions 150 may be a different shape. A dielectric layer 180 covers the cap layer 50a and the barrier layer 50b. The gate electrode 110 makes contact with the cap layer 50a through openings in the dielectric layer 180. Specifically, the gate electrode 110 rests on the cap layer 50a, because the dielectric layer 180 has an opening that accommodates the gate electrode 110. It is possible that in another embodiment, the openings 181 are absent so that the field plate 170 does not make electrical contact with the cap layer 50a in the EDR region 150.

The transistor shown in FIGS. 5A-5D is normally-off transistor with the cap layer 50a beneath the gate electrode 110. Normally-on transistors can be formed as well by removing the cap layer 50a from beneath the gate electrode 110. The field plate 170 makes electrical contact with the EDR region 150 at a location that is closer to the gate side. The drain side edge of field plate 170 does not extend beyond the drain side edge of the EDR regions 150, as shown in FIGS. 5A and 5D. In some examples, it is possible to have a second field plate (not shown) which extends beyond the drain side edge of EDR regions 150 with a thicker dielectric layer underneath the second field plate than the field plate 170. The field plate 170 may be connected to the gate electrode 110 or the source contact 100. In one example, there is a gate dielectric material beneath the gate electrode 110, insulating at least a part of the gate electrode 110 from contacting the cap layer 50a.

The barrier layer 50b, the channel layer 40, the buffer layer 30, the nucleation layer 20, and the substrate 10 may formed as described in Example 1.

Example 3

FIGS. 6A-6D shows three other embodiments. A top view of all of these embodiments is shown in FIG. 6A. Similar to FIG. 5A, the field plate 170 is disposed in the drain access region 115, separated from the gate electrode 110. The field plate 170 covers at least a portion of the EDR regions 150. The drain side edges of the EDR regions 150 are outside of the drain side edge of the field plate 170. In other words, the drain side edges of the EDR regions 150 are closer to the drain contact 120 than the drain side edges of the field plate 170. FIGS. 6B-6D show three different cross-sections taken along cut line A-A'.

In FIG. 6B, the EDR regions 150 are formed by creating trenches 200 in the barrier layer 50b and optionally into the channel layer 40, thereby reducing or removing the two-dimensional electron gas from the channel layer 40 in the EDR regions 150. Thus, free electrons 41 may only exist in portions of the drain access region 115 that are not EDR regions 150. A dielectric layer 180 is deposited in the trenches 200 and over the barrier layer 50b. The EDR region 150 is similar to the embodiment described in FIG. 3B.

A field plate 170 is formed over the dielectric layer 180. The trenches 200 may be planarized after the dielectric material is deposited into the trenches 200. The field plate 170 covers at least a portion of the EDR regions 150 and is separated from the barrier layer 50b by the dielectric layer 180. The field plate 170 may be connected to the source contact 100 or the gate electrode 110.

FIG. 6C shows another embodiment in which the EDR regions 150 comprise trenches 200. In FIG. 6C, the EDR regions 150 are formed by creating trenches 200 in the barrier layer 50b and into the channel layer 40, thereby removing the two-dimensional electron gas from the channel layer 40 in the EDR regions 150. Thus, free electrons 41 may only exist in portions of the drain access region that are not EDR regions 150. Further, the depth of the trench 200 extends below the interface between the barrier layer 50b and the channel layer 40. The field plate 170 also comprises protrusions 171 that extend into the trenches 200. The trenches 200 may be filled with a trench dielectric material 182. The trench dielectric material 182 may insulate the barrier layer 50b and the channel layer 40 from the protrusions 171 of the field plate 170. As shown in FIG. 6C, the bottom of the protrusions 171 extends beneath the interface of the barrier layer 50b and the channel layer 40 where the free electrons 41 are disposed. The trench dielectric material 182 may be the same material as the dielectric layer 180, or may be a different material.

Further, the dielectric layer 180 is disposed on top of the barrier layer 50b and separates the barrier layer 50b from the field plate 170. The dielectric layer 180 may be thicker than the thickness of the trench dielectric material 182. In other embodiments, the thickness of the dielectric layer 180 may be thinner or equal to the thickness of the trench dielectric material 182.

FIG. 6D shows another embodiment where the EDR region 150 is formed via ion implantation, as described in FIG. 3C. The species used for the ion implantation may be selected from nitrogen, argon, fluorine, magnesium or any other suitable element. The energy of the implant may be selected so that the implanted region 210 extends through the entire thickness of the barrier layer 50b and into the channel layer 40. This is done to eliminate the carriers. Alternatively, the energy of the implant may be selected so that the implanted region 210 extends through all or only a portion of the thickness of the barrier layer 50b. The implanted region 210 creates acceptors or traps reducing the free electrons 41 in the EDR region 150. A dielectric layer 180 covers the barrier layer 50b and the implanted regions 210. Further, a field plate 170 is formed over the dielectric layer 180. The field plate 170 may be connected to the source contact 100 or the gate electrode 110.

The transistor shown in FIGS. 6A-6D may be a normally-on transistor or a normally-off transistor. There may be gate dielectric underneath the gate electrode. To form a normally-off transistor, a Mg-doped III-nitride semiconductor layer may be disposed beneath the gate electrode 110 or a gate recess may be formed under the gate electrode 110 into the barrier layer 50b.

The barrier layer 50b is made of III-nitride semiconductors including AlGaN, AlN, InAlN, InGaN, GaN or InAlGaN. The III-nitride semiconductor of the barrier layer 50b immediately contacting the channel layer 40 has a wider band-gap than that of the III-nitride semiconductor of the channel layer 40 immediately contacting the barrier layer 50b.

Figure 7:
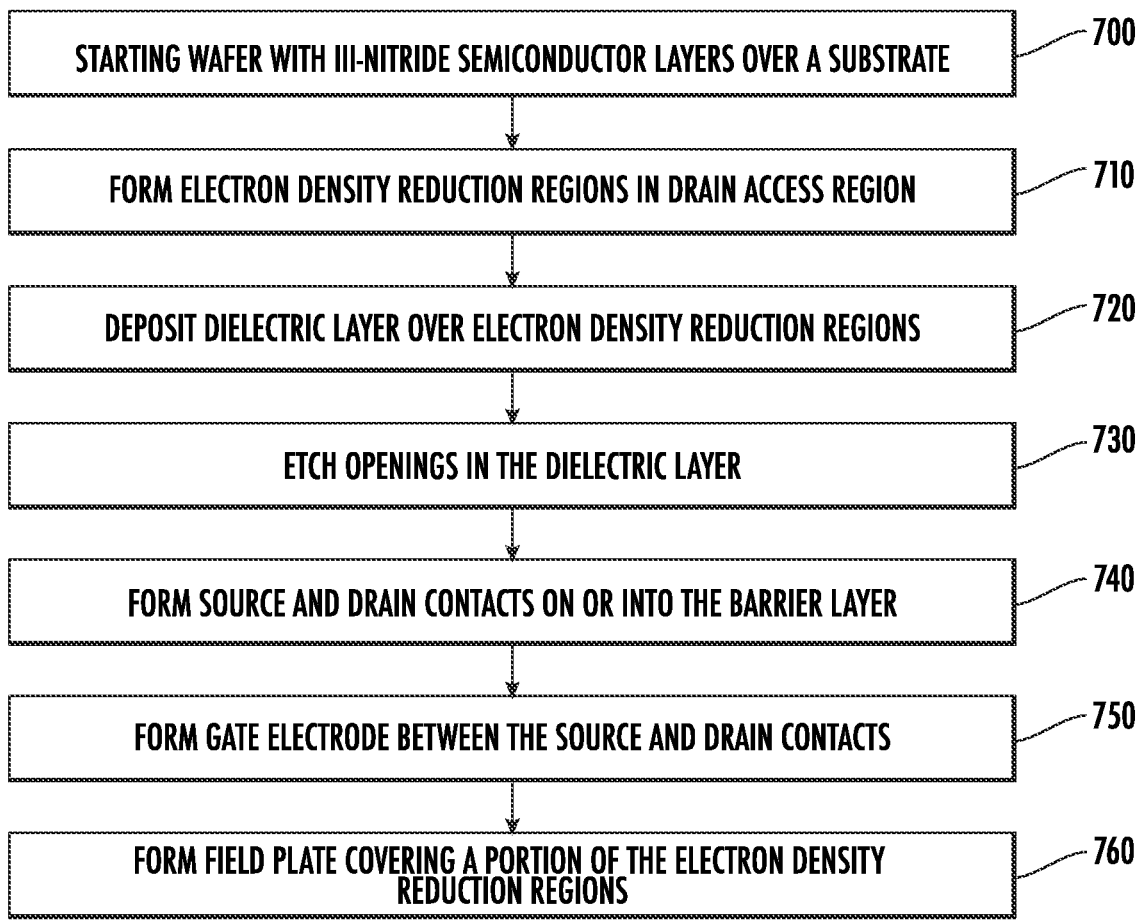
FIG. 7 shows a flowchart that shows the processes for making the embodiments described herein.

An example of fabricating the transistor structure described herein is shown in FIG. 7. First, as shown in Box 700, a wafer is provided. The wafer comprises a substrate 10, a nucleation layer 20 on top of the substrate and a buffer layer 30 disposed on the nucleation layer 20. A channel layer 40 is disposed in the buffer layer 30 and a barrier layer 50b is disposed in the channel layer.

Next, as shown in Box 710, the EDR regions 150 are formed in the wafer. As described above, this may be achieved in a number of ways.

As shown in FIG. 3B, the EDR regions 150 may be formed by etching portions of the barrier layer 50b to create trenches 200. In certain embodiments, the depth of the trenches 200 may be greater than the thickness of the barrier layer 50b. In other embodiments, the depth of the trenches 200 may be equal to or less than the thickness of the barrier layer 50b.

As shown in FIG. 3C, the EDR regions 150 may be formed by implanting species into the barrier layer 50b to create implanted regions 210. These implanted regions 210 may extend through the barrier layer 50b and into the channel layer 40.

As shown in FIG. 3D, the EDR regions 150 may be formed by depositing a cap layer 50a on the barrier layer 50b. Portions of the cap layer 50a, which are not part of the EDR regions 150 are then etched. The portions of the cap layer 50a that remain form the EDR regions 150.

As shown in FIG. 3E, the EDR regions 150 may be formed by depositing a cap layer 50a on the barrier layer 50b. Portions of the cap layer 50a, which are not part of the EDR regions 150 are then doped to become doped regions 220.

After the EDR regions 150 have been formed, a dielectric layer 180 is then deposited over the EDR regions 150, as shown in Box 720. The dielectric layer 180 may be deposited on the entirety of the barrier layer 50b (or the cap layer 50a if present). Thus, the dielectric layer 180 coats the barrier layer 50b in the source access region 105, and the drain access region 115. The dielectric layer 180 also fills or partially fills the trenches (if present).

Openings are then etched into the dielectric layer 180, as shown in Box 730. These opening are in the positions needed for the gate electrode 110, the source contact 100 and the drain contact 120. These openings may include ohmic recesses in the dielectric layer 180 and to or into the barrier layer 50b on both sides of the gate region. These openings also include a gate recess region, which is disposed in the dielectric layer 180.

As shown in Box 740, source contact 100 and drain contact 120 are formed in these ohmic recesses.

Next, as shown in Box 750, the gate electrode 110 is formed between the source contact 100 and the drain contact 120.

The sequence of forming the gate electrode 110, the source contact 100 and drain contact 120 may be changed. For example, gate electrode 110 may be formed before deposition of dielectric layer 180. Source contact 100 and drain contact 120 may be formed after the formation of the gate electrode 110.

Finally, as shown in Box 760, the field plate 170 is formed and covers at least a portion of the EDR regions 150.

Additional process steps not shown in FIG. 7 include depositing additional dielectric layers, and forming additional field plates, vias and interconnections.

The embodiments described above in the present application may have many advantages. The EDR regions 150 enable local control of the charge density in the drain access region 115 and provide control of the electric field in this drain access region 115. This control may be beneficial in at least two respects. First, this allows control of the trapping in the drain access region and dynamic on-resistance. Second, a reduction in electric field in certain locations may improve the breakdown voltage.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A semiconductor structure for use in a III-Nitride (III-N) semiconductor device, comprising:
 a channel layer;
 a barrier layer, wherein electrons are formed at an interface between the channel layer and the barrier layer;
 a source contact and a drain contact disposed in ohmic recesses in contact with the barrier layer;
 a gate electrode disposed between the source contact and the drain contact, wherein a region between the drain contact and the gate electrode comprises a drain access region; and
 one or more electron density reduction regions disposed in the drain access region which do not extend beneath and are separated from the gate electrode, wherein an electron density in the electron density reduction regions is reduced as compared to other portions of the drain access region.

2. The semiconductor structure of claim 1, wherein each electron density reduction region has a length (La) and a width (Wa), and is separated from an adjacent electron reduction region by a separation distance (Wb), wherein the separation distance (Wb) changes moving from the gate electrode to the drain contact.

3. The semiconductor structure of claim 1, wherein the electron density reduction regions comprise trenches wherein a depth of the trenches is less than, the same as, or greater than a thickness of the barrier layer.

4. The semiconductor structure of claim 1, wherein the electron density reduction regions comprise implanted regions in the barrier layer, wherein a depth of the implanted region is less than, the same as, or greater than a thickness of the barrier layer.

5. The semiconductor structure of claim 4, wherein the implanted regions are implanted with nitrogen, argon, fluorine, or magnesium.

6. The semiconductor structure of claim 1, wherein the electron density reduction regions comprise a cap layer disposed on the barrier layer, and wherein the cap layer is not disposed on the barrier layer in the other portions of the drain access region, and the cap layer comprises a Mg-doped III-nitride semiconductor.

7. The semiconductor structure of claim 1, further comprising a cap layer disposed on an entirety of the barrier layer in the drain access region, and wherein impurities are introduced into the cap layer disposed in the other portions of the drain access region to form doped regions and wherein the impurities are not introduced into the cap layer in the electron density reduction regions.

8. The semiconductor structure of claim 7, wherein the cap layer comprises a Mg-doped III-nitride semiconductor and the impurities comprise silicon, oxygen or hydrogen.

9. A semiconductor structure for use in a III-Nitride (III-N) semiconductor device, comprising:
 a channel layer;
 a barrier layer, wherein electrons are formed at an interface between the channel layer and the barrier layer;
 a source contact and a drain contact disposed in ohmic recesses in contact with the barrier layer;
 a gate electrode disposed between the source contact and the drain contact, wherein a region between the drain contact and the gate electrode comprises a drain access region;
 one or more electron density reduction regions disposed in the drain access region which do not extend beneath and are separated from the gate electrode, wherein electron density in the electron density reduction regions is reduced as compared to other portions of the drain access region and wherein a cap layer comprising a Mg-doped III-nitride semiconductor is disposed in the electron density reduction regions and not disposed in other portions of the drain access region; and
 a field plate disposed above at least a portion of the electron density reduction regions, and wherein portions of the field plate are separated from the electron density reduction region by a dielectric layer.

10. The semiconductor structure of claim 9, wherein a drain side edge of the field plate is closer to the drain contact than a source side edge of the electron density reduction region, and wherein a drain side edge of the electron density reduction region is at least as close to the drain contact as the drain side edge of the field plate.

11. The semiconductor structure of claim 9, wherein the dielectric layer is disposed in the region between the source contact and the drain contact.

12. The semiconductor structure of claim 9, further comprising a second field plate disposed between the field plate and the drain contact.

13. The semiconductor structure of claim 9, wherein the field plate is connected to the gate electrode.

14. The semiconductor structure of claim 9, wherein the field plate connects to the cap layer of the electron density reduction regions through openings in the dielectric layer.

15. A semiconductor structure for use in a III-Nitride (III-N) semiconductor device, comprising:
 a channel layer;
 a barrier layer, wherein electrons are formed at an interface between the channel layer and the barrier layer;
 a source contact and a drain contact disposed in ohmic recesses in contact with the barrier layer;

a gate electrode disposed between the source contact and the drain contact, wherein a region between the drain contact and the gate electrode comprises a drain access region;

one or more electron density reduction regions disposed in the drain access region, wherein electron density in the electron density reduction regions is reduced as compared to other portions of the drain access region and wherein the electron density reduction regions do not extend under and are separated from the gate electrode; and a field plate disposed above at least a portion of the electron density reduction regions, and wherein the field plate is separated from the electron density reduction region by a dielectric layer.

16. The semiconductor structure of claim 15, wherein the electron density reduction regions comprise trenches, and wherein a depth of the trenches is less than, the same as or greater than a thickness of the barrier layer.

17. The semiconductor structure of claim 16, wherein the field plate comprises protrusions that extend downward into the trenches below the interface between the channel layer and the barrier layer.

18. The semiconductor structure of claim 15, wherein the electron density reduction regions comprise implanted regions in the barrier layer and the channel layer, wherein a depth of the implanted region is smaller, the same or greater than a thickness of the barrier layer; and wherein the implanted regions are implanted with nitrogen, argon, fluorine, or magnesium.

* * * * *